(12) United States Patent
Arbitter et al.

(10) Patent No.: US 8,364,454 B2
(45) Date of Patent: Jan. 29, 2013

(54) SYSTEM AND METHOD OF DYNAMIC CLEARANCE CHECKING USING A GEOMETRIC MODEL

(75) Inventors: Daniel Arbitter, Plymouth, MI (US); David Roberts, Novi, MI (US); Sejal Shreffler, Beverly Hills, MI (US); Vincent Pesch, Chicago, IL (US); William Putnam, West Bloomfield, MI (US)

(73) Assignee: Ford Motor Company, Dearborn, MI (US)

( * ) Notice: Subject to any disclaimer, the term of this patent is extended or adjusted under 35 U.S.C. 154(b) by 2029 days.

(21) Appl. No.: 10/899,802

(22) Filed: Jul. 27, 2004

(65) Prior Publication Data

US 2006/0025983 A1   Feb. 2, 2006

(51) Int. Cl.
*G06G 7/48* (2006.01)
*G06F 9/45* (2006.01)

(52) U.S. Cl. .................................. 703/7; 703/8; 703/22
(58) Field of Classification Search ............. 703/22, 703/7, 8; 700/97, 98, 103, 104
See application file for complete search history.

(56) References Cited

U.S. PATENT DOCUMENTS

| | | | |
|---|---|---|---|
| 4,474,035 A | 10/1984 | Amin et al. | |
| 5,150,452 A | 9/1992 | Pollack et al. | |
| 5,177,982 A | 1/1993 | Plemens | |
| 5,347,459 A | 9/1994 | Greenspan et al. | |
| 5,515,489 A | 5/1996 | Yaeger | |
| 5,729,463 A * | 3/1998 | Koenig et al. | 700/98 |
| 6,453,209 B1 * | 9/2002 | Hill et al. | 700/95 |
| 6,647,306 B2 * | 11/2003 | Wu et al. | 700/98 |
| 6,725,184 B1 * | 4/2004 | Gadh et al. | 703/2 |
| 2005/0096885 A1 * | 5/2005 | Rhodes et al. | 703/1 |

* cited by examiner

*Primary Examiner* — Omar Fernandez Rivas
*Assistant Examiner* — Nithya Janakiraman
(74) *Attorney, Agent, or Firm* — Damian Porcari; Brooks Kushman P.C.

(57) ABSTRACT

A system and method for dynamically checking clearance within a geometric mesh model includes a user computer system having a remotely located computer system, and a data storage device. The method periodically updates a digital model of assembled component parts stored on the data storage device, interactively selects a predetermined clearance rule applicable to the digital model and interactively selects a predetermined clearance condition applicable to the selected clearance rule for the digital model that modifies the predetermined clearance rule. The method periodically calculates clearance within the assembled digital model using the selected clearance rule and the selected clearance condition and summarizing the clearance check. The clearance check summary identifies a clearance issue using a predetermined clearance checking criteria and submits the identified clearance issue to an issue manager software program for tracking clearance issues.

15 Claims, 5 Drawing Sheets

| | Digital Buck Web Application For Clearance Calculator | | |
|---|---|---|---|
| File Edit View Go Communicator | | | Help |

Bookmarks  Netsite: http://cc0176.pd9.ford.com:8021/wcc/jsp/

Back Forward Home Search Guide Print Security Stop

Digital Buck Web Application For Clearance Calculator

User: WPUTNAM  Program: V299  Product Id: 18

Pick Program | Manage Rules | Help | Problem Report | Home | Ford Hub

Program: V299

| Name | Rule Description | Type | Requirements | Action |
|---|---|---|---|---|
| 632 | | Exclusion | | Search  Create |

☐ check to itself

Please create conditions for the *highlighted* rules.

631 rule(s) returned

| Name | Rule Description | Type | Requirements | Actions | |
|---|---|---|---|---|---|
| | general non-interference | Interference | 0 | | |
| 631 | Exclude MP-3F23-010507-G7 check to MP-3F23-010507-G9 | Exclusion | 0 | Edit | Delete |
| 630 | Exclude 010101-V1 | Exclusion | 0 | Edit | Delete |
| 629 | Exclude 070200-P CPSC check | Exclusion | 0 | Edit | Delete |
| 628 | Exclude 011411-G6_PRPS1 | Exclusion | 0 | Edit | Delete |
| 627 | Exclude 011404-G7MTN | Exclusion | 0 | Edit | Delete |
| 626 | Exclude 010103-B1 check to 010804-C3 | Exclusion | 0 | Edit | Delete |
| 625 | Exclude MP-3F23-140100-D4 check to MP-3F23-140100-D5 | Exclusion | 0 | Edit | Delete |
| 624 | Exclude MP-3F23-011902-G8 check to C9 | Exclusion | 0 | Edit | Delete |

Issues Tracking Process

V229 Issues Tracking Metrics — 270

| Date | Calculation Start Time | Calculation End Time | Rules | Total | Non Compliant | Compliant | Not Applicable | Not Evaluated |
|---|---|---|---|---|---|---|---|---|
| 20020507 | 00:30 | 01:16 | Update With 621 Rules | 18376-499 | 281 | 3416 | 1548 | 13129 |
| 20020508 | 00:30 | 01:13 | Update With 621 Rules | 17260-483 | 252 | 3404 | 1364 | 12240 |
| 20020509 | 12:32 | 13:18 | Update With 631 Rules | 16761-469 | 269 | 3354 | 658 | 12480 |
| 20020510 | 00:30 | 01:04 | Update With 631 Rules | 16762-469 | 337 | 3526 | 803 | 12096 |
| 20020513 | 00:30 | 01:10 | Update With 631 Rules | 16711-482 | 337 | 3511 | 773 | 12090 |

FIG. 5

SYSTEM AND METHOD OF DYNAMIC CLEARANCE CHECKING USING A GEOMETRIC MODEL

BACKGROUND OF THE INVENTION

1. Field of the Invention

The present invention relates generally to computer-assisted design of models and, more specifically, to a system and method of dynamic clearance checking using a geometric model.

2. Description of the Related Art

Vehicle design, and in particular automotive vehicle design, has advanced to a state in which computer-assisted design techniques are frequently incorporated in the development of a new vehicle, or redesign of an existing vehicle. At the same time, enhanced visualization software tools have been developed that allow for interactive display and manipulation of large-scale geometric models, including models developed using Computer-Aided Design (CAD). The combined use of Computer-Aided Design and visualization techniques is especially beneficial in designing, packaging and assembling various proposals into a vehicle model, to evaluate the design and functional capabilities of the vehicle model. Advantageously, potential vehicle model designs can be considered in a timely and cost-effective manner by analyzing a digital representation of a proposed design, versus preparing a physical prototype of the vehicle.

One aspect of the design process is to construct a geometric model of the proposed design using a technique known as Computer-Aided Design (CAD). Another aspect of the design process is the use of mathematical tools, collectively referred to as Computer-Aided Engineering (CAE), to constrain and guide the designer in evaluating the design and to optimize the performance of the design. The use of a CAE simulation allows for verification of a design intent, including its systems, subsystems and components, and suggestion for improvement. CAE simulations are advantageous in various types of vehicle analysis, such as vehicle safety analysis. Examples of CAE techniques include Finite Element Analysis (FEA), Computational Fluid Dynamics (CFD), and visualization analysis. Various software tools are available to perform the CAE analysis. Recent enhancements to the software and the computing power of modern computers have resulted in a reduction in the amount of computer processing time required to perform the CAE analysis. Therefore, CAE tools can be utilized earlier in the design process and applied to a wider range of product development activities.

Various methods are utilized to evaluate a proposed design of a model, such as the vehicle of this example. Previously, a physical "buck" or prototype of the model was built to provide information regarding the proposed model design. For example, clearance, or the physical distance between component parts is extremely important to the designer, since it describes how individual component parts fit together in the model. An interference condition occurs when one component part intrudes into the physical space of another component part. The physical buck provides clearance information visually, however; it is time consuming to build the physical buck, and to update the physical buck as the design changes.

An emerging trend in the model design process, as a result of enhanced CAE computational capabilities, is the use of a digital buck or digital prototype to analyze a particular design concept. In the past, the digital buck would be interrogated for clearances on an intermittent basis, and the clearance results were stored in a database. While this strategy works, it is time consuming to periodically perform the clearance analysis and costly to rework a component if a clearance concern is detected. Also, there wasn't a process in place that integrated clearance rule definitions, clearance calculator software, clearance study results and potential issue management.

Thus, there is a need in the art for a system and method of automatically integrating clearance rules and conditions for checking clearance between component parts within a geometric model using these clearance rules and conditions, and to provide the results to an issue manager in a customizable format.

SUMMARY OF THE INVENTION

Accordingly, the present invention is a system and method of dynamic clearance checking using a geometric model. The system includes a user computer system having a processor, a user input device and a display device, and a remotely located computer system having a processor and operatively in communication with the user computer system. The system also includes a data storage means operatively in communication with the remotely located computer system and the user computer system for storing information.

The method includes the steps of periodically updating a model representing a digital buck of assembled component parts that is stored on the data storage means, interactively selecting a predetermined clearance rule applicable to the digital buck and interactively selecting a predetermined clearance condition applicable to the selected clearance rule that modifies the predetermined clearance rule. The method also includes the steps of periodically calculating clearance within the digital buck using the selected clearance rule and the selected clearance condition and summarizing the clearance check. The method further includes the steps of the user reviewing the clearance check summary to identify a clearance issue using a predetermined clearance checking criteria and submitting the identified clearance issue to an issue manager software program for tracking clearance issues.

One advantage of the present invention is that a system and method of dynamically checking clearance within a geometric model is provided that integrates available software tools with engineering knowledge and best practice guidelines. Another advantage of the present invention is that the system and method of dynamically checking clearance within a geometric model is provided that improves design process efficiency by identifying clearance concerns earlier in the design process. Still another advantage of the present invention is that a system and method of dynamically checking clearance within a geometric model is provided that is part of an integral expert system to reduce the amount of data checked. A further advantage of the present invention is that a system and method of dynamically calculating clearance in a geometric model is provided that automatically utilizes best engineering practices in calculating clearance between component parts in a model. Still a further advantage of the present invention is that a system and method of dynamically checking clearance in a geometric model is provided that is a cost and time savings as compared to previous methods. Yet a further advantage of the present invention is that a system and method of dynamically checking clearance is provided that improves the quality of the clearance review. Still a further advantage of the present invention is that a system and method of dynamically checking clearance in a geometric model is provided that reduces late engineering changes prior to a build of a prototype physical model.

Other features and advantages of the present invention will be readily appreciated, as the same becomes better understood after reading the subsequent description taken in conjunction with the accompanying drawings.

BRIEF DESCRIPTION OF THE DRAWINGS

FIGS. 3-6 are diagrammatic views of a series of computer screens illustrating the implementation of the method of FIG. 2 using the system of FIG. 1, according to the present invention.

DESCRIPTION OF THE PREFERRED EMBODIMENT(S)

The design of a model of a system may be achieved using a generic, parametric driven design process. Advantageously, the parametric process allows for flexibility in design and engineering analysis of the model in a fraction of the time required using conventional design methods. Various computer-based tools are integrated to achieve this enormous time and expense savings, including solid modeling, parametric design, and automated studies. In this example, the parametric design process is applied to a vehicle system. The vehicle design is typically generated through the use of conventional computer-aided design (CAD), including computer-aided manufacturing (CAM) and computer-aided engineering (CAE) techniques.

Figure 1:
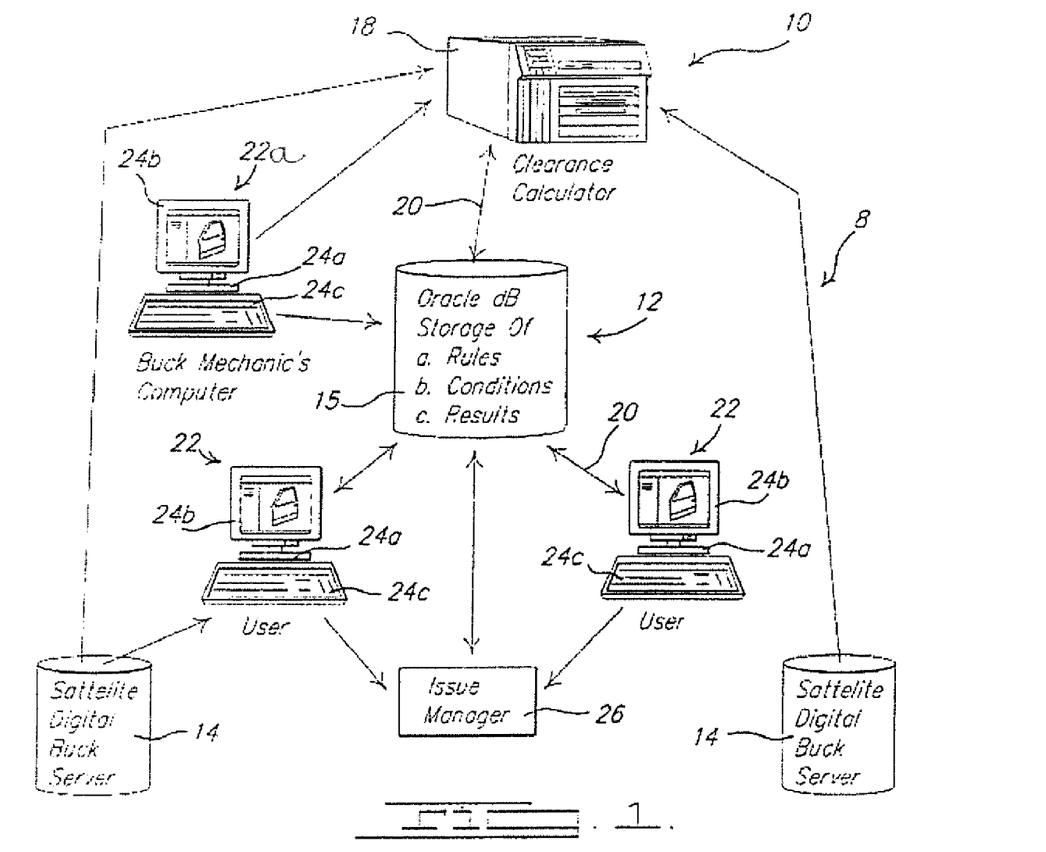
FIG. 1 is a diagrammatic view of a system for use in conjunction with a method of dynamic clearance checking using a geometric model, according to the present invention.

Referring to the drawings and in particular to FIG. 1, a system 8 for dynamically calculating clearance using a geometric model of a design is provided. The system 8 includes a remotely located computer system 10. The remotely located computer system 10 includes a server 18 having a processor, and a memory. The remotely located computer system 10 is in communication with other computer systems, to be described, using a communications network 20. The communications network 20 may include the Internet, an intranet, or other such network used to transfer information.

The system 8 includes a data storage device 12 operatively in communication with the remotely located computer system 10 via the communications network. The data storage device provides for electronic storage of data. The data storage device 12 may be part of an interconnected network of data storage devices, each containing an electronic representation of data. For example, the data may be a knowledge based engineering library including various experts' knowledge of information relevant to the design of a product, such as the vehicle of this example. These libraries may include information such as design, assembly, manufacturing, or safety rules and guidelines, or the like. In this particular example, a clearance knowledge-based engineering library 15 includes guidelines defining clearance-related best practices to assessable to the data storage device 12. These clearance best practices define rules, such as buildable conditions, zero clearance conditions, tolerances or the like. In addition, the clearance knowledge-based engineering library 15 may include conditions such as which rule applies to a particular model type. It should be appreciated that the results of a clearance calculation may also be stored in the data storage device 12.

The data storage device 12 may also contain a library of data in electronic form regarding various types of vehicle subsystems, such as a component parts library of particular component parts used on a vehicle. The data storage device 12 may further contain a library of predetermined product assumptions regarding the vehicle to be designed, such as model year, available style configurations, or production volume.

The computer system 10 may also include various Computer-Aided Design (CAD) tools (not shown) which may be used to generate a model. These design tools may include solid modeling, surface modeling visualization and parametric design techniques. Solid modeling, for example, takes electronically stored vehicle model data from a model library and standard component parts data from a knowledge-based engineering library and build complex geometry for part-to-part or full assembly analysis. Several modeling programs are commercially available and generally known to those skilled in the art, such as VISMOCKUP. The parametric design technique is used in the electronic construction of geometry within the user computer system 22, for designing the vehicle or a portion thereof. As a particular dimension or parameter is modified, the computer system 22 is instructed to regenerate a new geometry.

The computer system 10 may also include various computer-aided engineering (CAE) analysis tools (not shown). One example of a CAE analysis tool is a preprocessor used to convert a CAD model into a geometric mesh model. The selection of the software tool is dependent on the capability of the particular software tool and the model being assembled. It should be appreciated that the selection of the software tool will affect the integrity of the assembled model, and it is foreseeable that different tools can generate different models.

The computer system 10 also includes a digital buck model library 14, preferably stored on a remotely located electronic storage device. In this example, the digital buck model library 14 contains an electrical representation of a vehicle model or a portion thereof, referred to as a digital buck 30 is an assembly of individual component parts 32. The models may be stored in a CAD, visualization, mesh format or the like, and may be generated using the previously described CAD and CAE techniques. It should be appreciated that the model library 14 may be a sub-library accessible to the data storage device 12.

The system 8 also includes another user computer system 22 having a processor, and a memory shown at 24a to process information relevant to the method for dynamically determining clearance using a geometric mesh model. The user computer system 22 includes a display device 24b, such as a display terminal, to display information to the user. The user may be a buck mechanic, project engineer or other person with responsibility for the design of the model. Each user may have their own computer systems, such as the buck mechanic computer system shown at 22a, which are linked via the communications network 20.

In this example, information is displayed on the display device 24b in a series of screens, also referred to as a browser. A user, such as the buck mechanic or project engineer or other person, inputs information into the corresponding user computer system 22 when prompted to do so. The information may represent different parameter alternatives. The set of parameters or the set of instructions may be specific to the method of dynamically determining clearance using a geometric model, wherein other data and information non-specific to the method may already be stored in the memory of the user computer system 22. Selection and control of the information within a screen can be achieved by the user, via a user interactive device 24c, such as a keyboard or a mouse.

An example of an input method is a drawing technique used to draw a box around a local region of the model using the user interactive device 24c, such as the mouse. It should be appreciated that the drawing process includes a click, drag and release of the mouse, as is understood in the art. Another type of input method is a graphical user interface that allows menu selection, parameter modification and performs other types of viewing operations. Still another example of an input method is a pop-up dialog box containing available information or instructions, or a tool bar containing available options. Preferably, the user systems are configured to provide for fast display capability for rendering and viewing of complex mesh models.

The system further includes an issue manager 26 operatively in communication with the remotely located computer system 10 via the communications network 20, and assessable to the responsible user. It should be appreciated that the issue manager is a resident software program for managing and tracking identified clearance issues. The issue manager software program 26 is utilized to track issues and to provide a summary or report of the results of a clearance calculation for a particular model. The report is advantageously customizable to a particular user, such as by highlighting identified issues. The issue manager software program may be resident in the memory of the remotely located computer system 10, or another computer system.

The executable clearance checking computer software program utilizes the set of information or instructions from various inputs, including but not limited to the users, information from the data storage device 12, library 14, design tools, and any other information to carry out a method, according to the present invention and discussed in detail subsequently, of dynamically integrating software tools with engineering knowledge and best practices to compute and manage component part clearance and or interference issues in digital buck data. The executable clearance checking software program may be implemented by the user, or automatically executed on a periodic basis in a manner to be described. The clearance checking software program may be resident on the remotely located computer system 18 and accessible by the user computer system 22, or resident on the user computer system 22. Advantageously, this is a time and cost savings as compared to previous methods of using a digital buck to compute and evaluate clearances between component parts or performing the same evaluation using a physical prototype. In addition, the computer-implemented method of dynamically checking clearance using a geometric model combines all of the foregoing to provide an efficient, flexible, rapid tool for evaluating the various design proposals. Furthermore, the results are available for further analysis and study.

Figure 2:
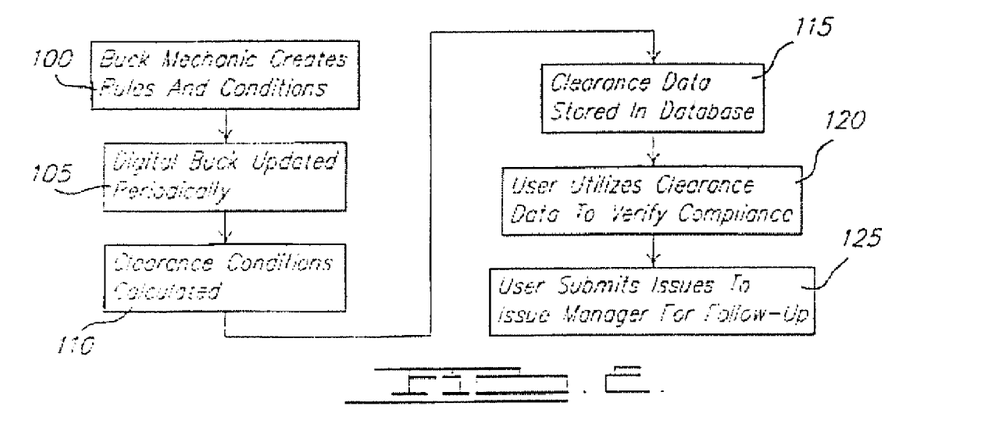
FIG. 2 is a flowchart of a method of dynamic clearance checking of a geometric model using the system of FIG. 1, according to the present invention.

Referring to FIG. 2, a flowchart of a method of dynamic clearance checking using a geometric model is provided. This methodology advantageously integrates available software tools with rule-based engineering knowledge of clearance practices and conditions to evaluate a geometric mesh model.

The methodology advances to block 100, and a user, such as the buck mechanic, utilizes the buck mechanics' computer system 22a to define applicable clearance rules and conditions incorporating engineering practice standards for a particular design. These clearance rules and conditions may include technical specifications and guidelines, and may be maintained in a database, such as the knowledge-based engineering clearance condition and rule library 15 previously described. In this example, clearance rules and conditions are available which detail the desired clearance or physical spacing between each component part 32 in the geometric model 30. An example of a rule includes calculations for determining clearance between component parts 32. An example of a condition is a situation that modifies a rule, such as a bracket attached to a frame can have a zero clearance. For example, the buck mechanic utilizes the clearance checking software program to define the clearance rules and conditions. The buck mechanic is presented a screen on the display device 24b with choices of rules and conditions to be applied to a model. An example of the type of information displayed on the screen, is shown in FIG. 3 at 200. The user can select from various options, including but not limited to selecting a rule as shown at 205, or highlighting a rule and creating a condition for the highlighted rule, as shown at 210. The methodology advances to block 105.

In block 105, the digital buck 30 is dynamically created and updated. The digital buck 30 may be representative of a particular group of components 32 or an entire model. The digital buck 30 is created from the CAD model, and preferably is in a visualization format. Various commercially available software programs are readily available to assemble the component parts together into a visualization representation of the model, such as EAI's VisMockup. In this example, a plurality of component parts 32 are selected for inclusion in the digital buck 30, and the component parts may be grouped and provided a group name for reference purposes. It should be appreciated that the software assembles the individual component parts together in a predetermined manner to generate a visualization file. Preferably, the digital buck model is dynamically updated on a periodic basis, which in the example is every night. It should be appreciated that the order of the steps of the user creating the rules and conditions and updating of the digital buck may be independent of each other.

The digital buck 30 is preferably stored in a database, such as the previously described knowledge-based engineering digital buck library 14. An advantage of storing the digital buck in a library is that different design programs for similar products can share a common library. This may result in a significant timesaving in preparing the mesh data. Other knowledge-based libraries may be available to the user, such as a master weld knowledge-based library-containing information for connecting two component parts by welding or a connector library for connecting component parts together using a mechanical connector such as a hinge. The methodology advances to block 110.

In block 110, the methodology periodically computes clearances within the digital buck 30 using the clearance checking software program. It should be appreciated that the user may select a portion of the digital buck to evaluate, or the entire model. The program utilizes previously defined digital buck data stored in the digital buck model library 14, and rules and conditions from the data storage device 12, to perform the clearance computations. The clearance calculator may be dynamically implemented on a periodic basis, such as daily, or upon the initiation of the user.

In this example, the methodology accesses the knowledge-based engineering library of clearance rules and clearance conditions 15 to obtain information regarding suggested clearance rules for each of the component parts 32 in the digital buck 30.

The clearance calculator software program advantageously integrates engineering knowledge with known clearance best practices to automatically evaluate the digital buck, and make the results available for further analysis or follow-up. Using a digital buck is timesaving over the current manual clearance checking practice. It also ensures the quality and consistency of the calculations between models.

The methodology advances to block 115 and the results of the clearance check are stored in a database, in the data storage device 12. It should be appreciated that the methodology may summarize the results of the clearance check in a report format, and highlight areas of concern, in a manner to be described.

Figure 4:
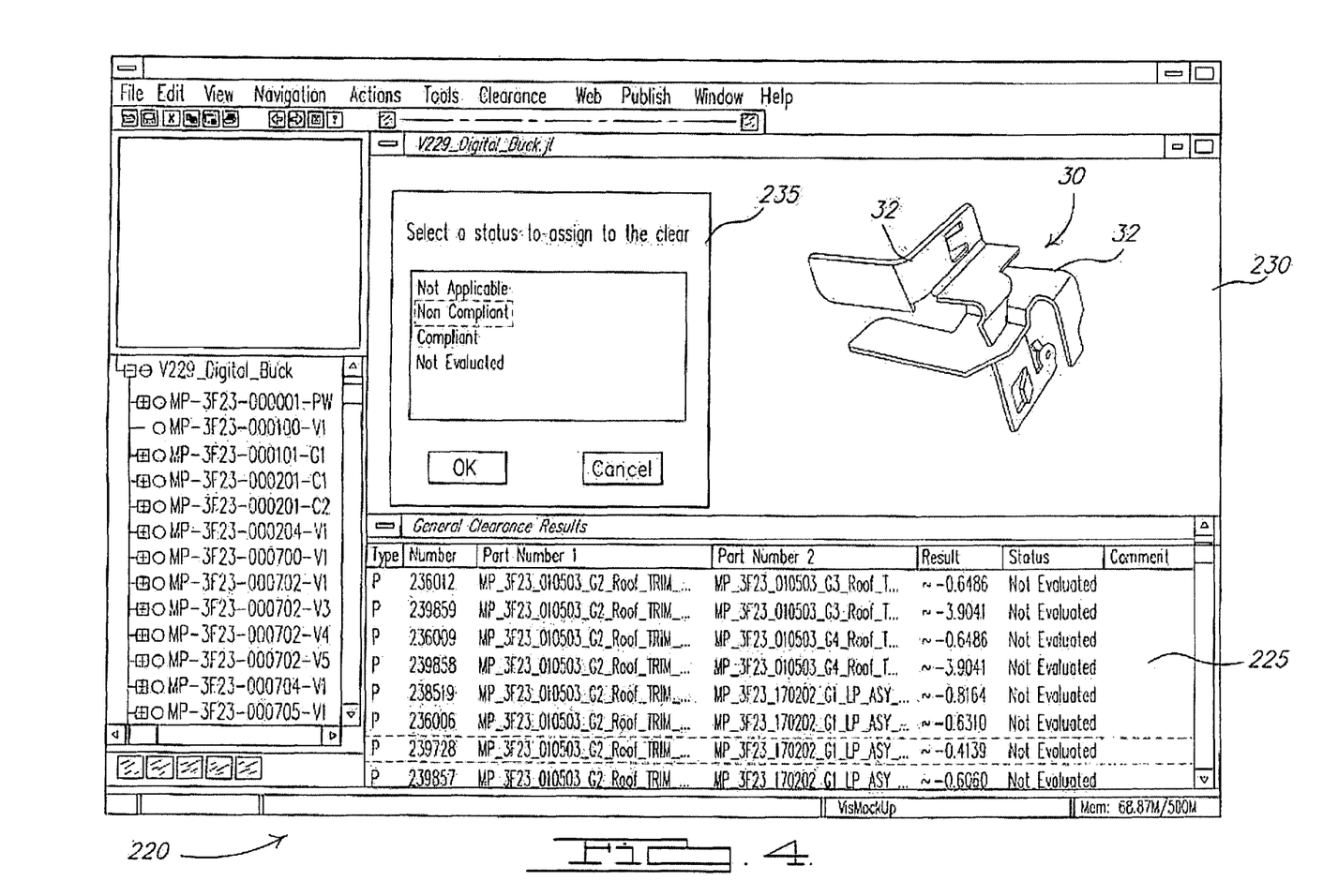

The methodology advances to block 120, and the user reviews the results of the clearance calculator to verify compliance with a predetermined criteria. The methodology summarize clearance conditions between component parts to assist the user in determining if the clearance between the component parts meets predetermined rules and conditions. It should be appreciated that the clearance check report may be displayed as a screen on the display device 24b, as shown in FIG. 4 at 220. In this example, the results of the clearance check are indicated in various formats. For example, the user may receive a list of information regarding clearance between particular parts as shown at 225. The user can visually inspect the clearance between component parts 32, as shown in a window at 230. The user can assign a status to the clearance, as shown in the window at 235. Preferably, a visual indicator is utilized for providing the user with information at a glance. For example, a problem clearance area may be highlighted in red, a caution clearance area highlighted in yellow, and acceptable clearance highlighted in green. The clearance condition for a particular component, or group of components may also be indicated in a message to the user, such as an email alert. The user has the option of modifying a component part 408 and changing the component part mesh, to avoid clearance issues in the finished model. The methodology advances to block 125.

Figure 5:
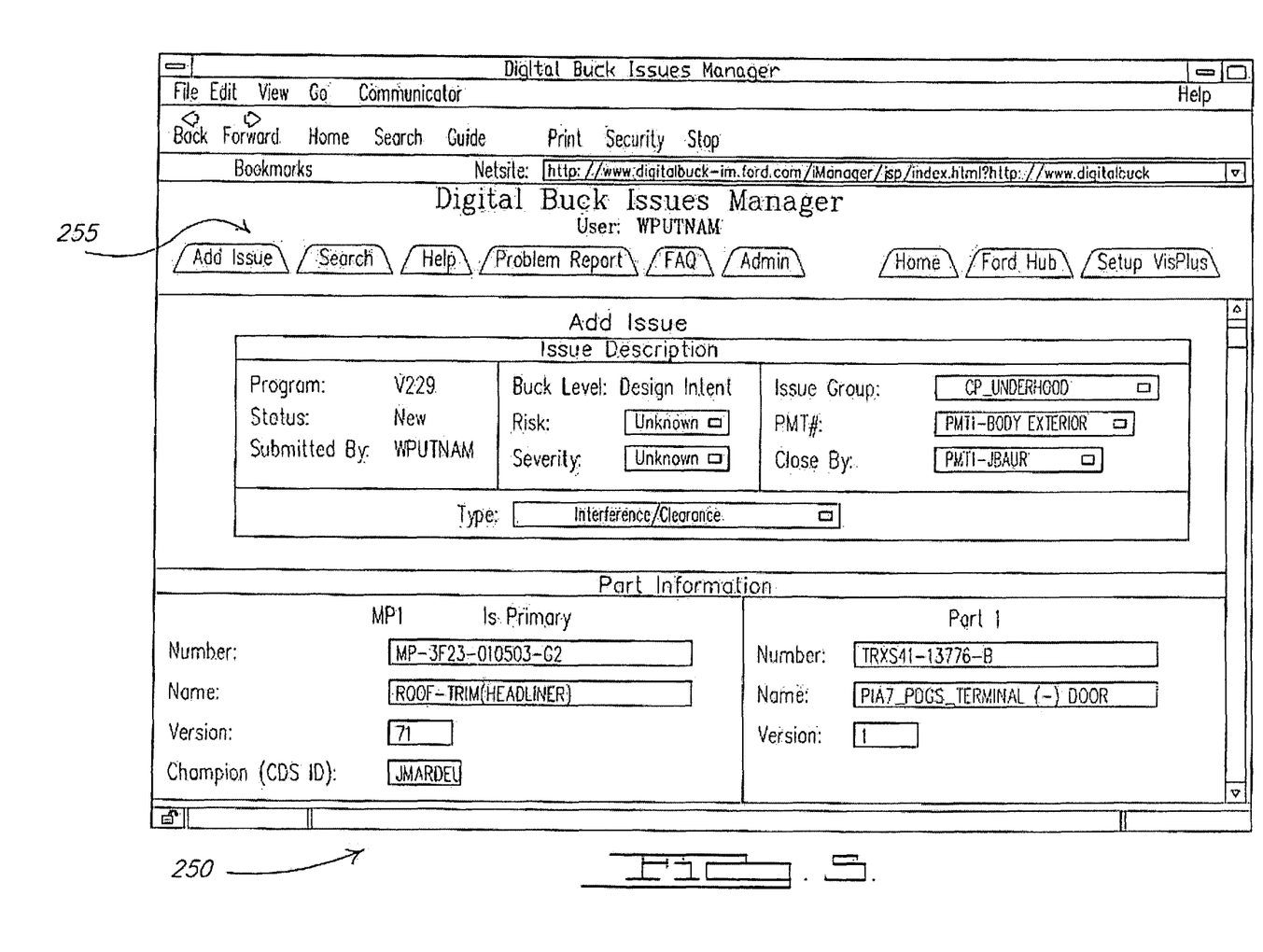

In block 125, the user submits identified issues from the clearance check to an issue manager for follow-up purposes. The user may utilize the input device to submit an identified issue to the issue manager from within the clearance calculator window. For example, the user may right click an "add issue" tab and a menu pops up to assist the user in transferring the identified issue to the issue manager program. It should be appreciated that in this example the issue manager is a computer-based issue tracking software program for identifying and tracking issues. The issue manager may be resident in the memory of the remotely located computer system. The identified issues may be stored in a database associated with the data storage device 12. The issue manager captures the identified issues in a report format that is available to other users. It is contemplated that the issue manager may include an alert means for sending a message, such as an electronic communication, to another user notifying them that there is a clearance concern with a component part for which they have responsibility. An example of the issue manager is shown in FIGS. 5 and 6. In FIG. 5, an example of a screen for the issue manager is illustrated at 250. The user can select from various options, including to add or delete an issue, search for issues, generate a problem report or the like as shown at 255. An example of an issue tracking report in a user defined format is illustrated in FIG. 6 at 270. In this example, the issue tracking report is summarized in matrix form, enabling the user to quickly evaluate the status of a particular issue.

The above-described methodology is implemented by a dynamic clearance checking software program. It should be appreciated that the above-described methodology is executable in an iterative manner. In addition, the user may elect to consider various sets of design parameters for a component part as part of a comprehensive study, or compare the results of proposed modifications to a component part.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method of dynamic clearance checking within a geometric model of preassembled component parts using a computer system, said method comprising:
    periodically updating the geometric model wherein the geometric model is a digital buck of preassembled component parts that is stored on a data storage device associated with the computer system;
    interactively selecting a predetermined clearance rule for each of the preassembled component parts in the digital buck using an executable clearance check software program resident on the computer system;
    interactively selecting a predetermined clearance condition applicable to the selected clearance rule for each of the preassembled component parts in the digital buck, wherein the clearance condition modifies the corresponding selected clearance rule;
    periodically checking clearance within the digital buck using the clearance check software program by calculating a clearance value between each of the preassembled component parts within the digital buck using the selected clearance rule and the corresponding selected clearance condition for each of the preassembled component parts in the digital buck;
    summarizing the clearance check for each of the preassembled component parts within the digital buck wherein the clearance check summary includes the calculated clearance values between each of the preassembled component parts in the digital buck; and
    using the clearance check summary to identify a noncompliant clearance value in the clearance check summary using a predetermined clearance criteria for each of the preassembled component parts.

2. A method as set forth in claim 1 wherein said updating the digital buck further includes selecting a geometric mesh model of component parts from a computer-based library of component parts and assembling the component parts together into a preassembled geometric model using a visualization format.

3. A method as set forth in claim 1 wherein said selecting a clearance rule further includes selecting a clearance rule from a knowledge-based engineering library of predetermined clearance rules that is stored on a data storage device associated with the computer system.

4. A method as set forth in claim 1 wherein said selecting a clearance condition further includes selecting a clearance condition from a knowledge-based engineering library of predetermined clearance conditions that is stored on a data storage device associated with the computer system.

5. A method as set forth in claim 1 wherein the clearance rule and clearance condition for each of the preassembled component parts includes technical specifications, or guidelines, or standards associated with each of the preassembled component parts in the digital buck.

6. A method as set forth in claim 1 wherein the computer system includes a user computer system, a remotely located computer system operatively in communication with the user computer system, and a data storage device operatively in communication with the remotely located computer system and the user computer system.

7. A method as set forth in claim 1 wherein the clearance rule defines a physical distance between each of the preassembled component parts in the digital buck.

8. A method as set forth in claim 1 wherein the identified noncompliance with clearance criteria from the clearance check summary are submitted to an executable issue manager software program that tracks identified clearance noncompliance in the digital buck.

9. A method as set forth in claim 1 further including highlighting non-compliance with clearance rules and conditions in a user-defined clearance check summary.

10. A method of dynamic clearance checking within a geometric model of preassembled component parts using a computer system, said method comprising:

periodically updating the preassembled geometric model wherein the preassembled geometric model is a digital buck of preassembled component parts, using a remotely located computer system, and the digital buck is stored on a data storage device operatively in communication with the remotely located computer system;

interactively selecting a predetermined clearance rule for each of the preassembled component parts in the digital buck using an executable clearance check software program accessible by a user computer system, wherein the predetermined clearance rule is selected from a knowledge-based engineering library of clearance rules stored in the data storage device and operatively in communication with the user computer system;

interactively selecting a predetermined clearance condition for the selected clearance rule for each of the preassembled component parts in the digital buck, wherein the predetermined clearance rule is selected from a knowledge-based engineering library of clearance rules stored in the data storage device, and the clearance condition modifies the corresponding selected clearance rule associated with each of the preassembled component parts;

periodically checking clearance within the digital buck using the clearance check software program by calculating a clearance value between each of the preassembled component parts within the digital buck using the selected clearance rule and the corresponding selected clearance condition for each of the preassembled component parts in the digital buck;

summarizing the clearance check for each of the preassembled component parts within the digital buck wherein the clearance check includes the calculated clearance value between each of the preassembled component parts in the digital buck; and identifying a noncompliant clearance value in the clearance check summary using a predetermined clearance criteria for each of the preassembled component parts in the digital buck, wherein the clearance check summary is selectively displayed on a display screen associated with the user computer system.

11. A method as set forth in claim 10 wherein said updating the digital buck further includes selecting a geometric mesh model of component parts from a library of component parts and assembling the component parts together into a preassembled geometric module using a visualization format, and storing the updated digital buck in the data storage means.

12. A method as set forth in claim 10 wherein the clearance rule and clearance condition for each of the preassembled component parts includes technical specifications, or guidelines, or standards associated with packaging the preassembled component parts together within the digital buck.

13. A method as set forth in claim 10 wherein the clearance rule defines a physical distance between each of the preassembled component parts in the digital buck.

14. A method as set forth in claim 10 wherein the clearance check summary is submitted to an executable issue manager software program that tracks identified clearance noncompliance in the digital buck.

15. A method as set forth in claim 10 further including highlighting non-compliance with clearance rules and conditions in a user-defined clearance check summary.

* * * * *